United States Patent [19]

Miyagi

[11] Patent Number: 5,611,863
[45] Date of Patent: Mar. 18, 1997

[54] SEMICONDUCTOR PROCESSING APPARATUS AND CLEANING METHOD THEREOF

[75] Inventor: Katsushin Miyagi, Sagamihara, Japan

[73] Assignees: Tokyo Electron Limited, Tokyo; Tokyo Electron Tohoku Limited, Esashi, both of Japan

[21] Appl. No.: 517,286

[22] Filed: Aug. 21, 1995

[30] Foreign Application Priority Data

Aug. 22, 1994 [JP] Japan ................... 6-196535

[51] Int. Cl.⁶ .................................................. C23C 16/00
[52] U.S. Cl. ....................... 118/723 MP; 118/723 MR; 118/723 E
[58] Field of Search ................... 118/723 ME, 723 MR, 118/723 MA, 723 MP, 723 E, 723 ER; 156/345; 204/298.33, 298.07

[56] References Cited

U.S. PATENT DOCUMENTS

| 4,816,113 | 3/1989 | Yamazaki | 156/643 |
|---|---|---|---|
| 4,971,667 | 11/1990 | Yamazaki et al. | 204/192.32 |
| 5,368,685 | 11/1994 | Kumihashi et al. | 156/643 |
| 5,512,102 | 4/1996 | Yamazaki | 118/723 MW |

FOREIGN PATENT DOCUMENTS

| 61-101029 | 5/1986 | Japan . | |
|---|---|---|---|
| 61-79747 | 5/1986 | Japan . | |
| 0174623 | 8/1986 | Japan | 118/723 ER |
| 5-33138 | 2/1993 | Japan . | |
| 5-117867 | 5/1993 | Japan . | |
| 405139881 | 6/1993 | Japan | 118/723 ER |

Primary Examiner—R. Bruce Breneman
Assistant Examiner—Joni Y. Chang
Attorney, Agent, or Firm—Oblon, Spivak, McClelland, Maier & Neustadt, P.C.

[57] ABSTRACT

An ECR plasma CVD apparatus includes a plasma generation chamber to which a microwave and a plasma source gas are introduced. An excitation solenoid is arranged around the plasma generation chamber to form an electron cyclotron resonance magnetic field with the microwave in the plasma generation chamber. A plasma reaction chamber to which a reactive gas is introduced is provided in communication with the plasma generation chamber. A substrate holder for holding a silicon wafer is set in the plasma reaction chamber. A leakage-type butterfly valve whose opening degree can be freely controlled is arranged in communication with the plasma reaction chamber. A turbo molecular pump is formed in the outlet of the butterfly valve. A subpump is arranged in the outlet of the turbo molecular pump.

9 Claims, 2 Drawing Sheets

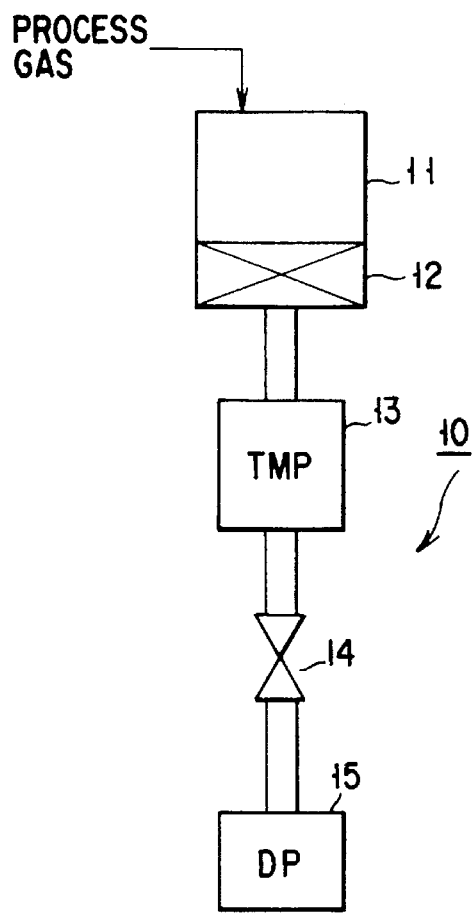
F I G. 1A
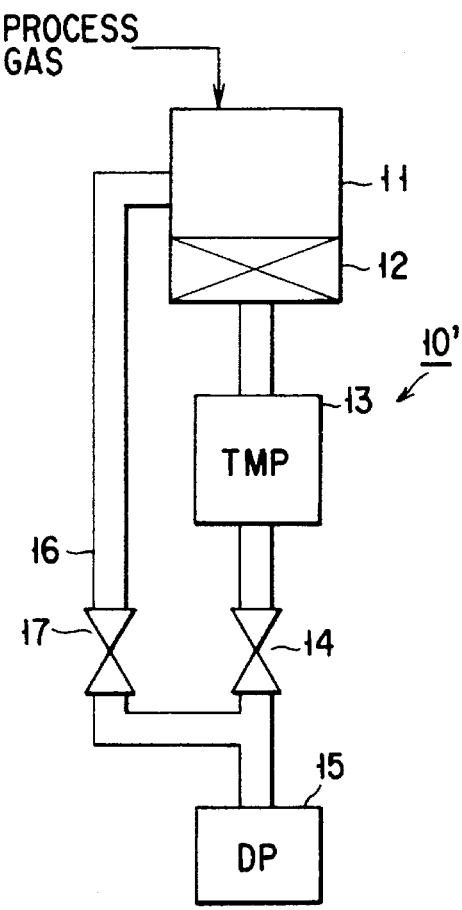
F I G. 1B
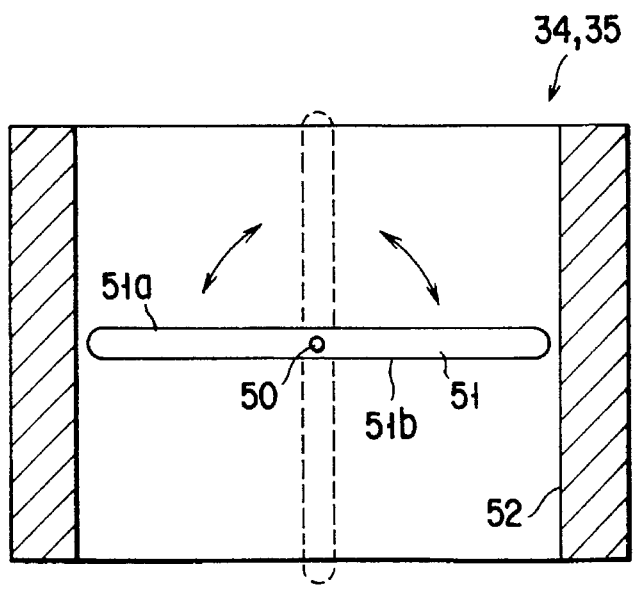
F I G. 3

5,611,863

SEMICONDUCTOR PROCESSING APPARATUS AND CLEANING METHOD THEREOF

BACKGROUND OF THE INVENTION

1. Field of the Invention

The present invention relates to a semiconductor processing apparatus and, more particularly, to an electron cyclotron resonance plasma CVD (to be referred to as an ECR plasma CVD hereinafter). The present invention further relates to a method of cleaning a semiconductor processing apparatus.

2. Description of the Related Art

A silicon oxide film is formed as, e.g., an insulating interlayer in a manufacturing process for a semiconductor device. A silicon oxide film is required for various properties such as feasibility of low-temperature film deposition, a small internal stress of the film, a low etching rate, a good film thickness distribution, good step coverage, and an excellent water permeability resistance.

As a film deposition method for fully satisfying these conditions, there is an ECR plasma CVD method. FIG. 1A is a schematic view showing a conventional ECR plasma CVD apparatus 10. Referring to FIG. 1A, reference numeral 11 denotes a plasma processing chamber constituted by an airtight vessel. A turbo molecular pump 13 is connected to this plasma processing chamber 11 via a gate valve 12. A dry pump 15 is connected to this turbo molecular pump 13 via a valve 14. A molecular drag pump may be used instead of the turbo molecular pump 13.

The film deposition process according to the ECR plasma CVD method is performed as follows. First, the gate valve 12 are opened. In this condition, the turbo molecular pump 13 and the dry pump 15 are driven to keep the interior of the plasma processing chamber 11 in a high vacuum condition. The high vacuum condition is, for example, pressure of several mTorr. In the plasma processing chamber 11 under this high vacuum condition, a target object is placed, and a process gas is introduced to perform a film deposition process.

In the above film deposition process, reaction products are deposited not only on the target object but also on any surface of the inside of the plasma processing chamber 11. To remove the reaction products on the plasma processing chamber 11, so-called in situ cleaning is regularly performed inside the plasma processing chamber 11. A plasma for cleaning is generated in the plasma processing chamber 11 to remove reaction products deposited inside the plasma processing chamber 11 by etching. Such a cleaning process is normally performed in an atmosphere of a higher pressure than the pressure of a normal film deposition process. The pressure for the cleaning process is, for example, several Torr.

The pressure for the cleaning process, however, is higher than an maximum pressure 0.5 m Torr in which the turbo molecular pump 13 can operate. Therefore, the turbo molecular pump 13 must be temporarily stopped in the above in situ cleaning. However, if the turbo molecular pump 13 is stopped every cleaning process, the production efficiency is greatly decreased because the start and stop of the normal turbo molecular pump 13 require 15 minutes and 10 minutes, respectively.

To avoid the above disadvantage in the prior art, a bypass exhaust pipe 16 is connected to between a plasma processing chamber 11 to a pipe which couples a valve 14 to a dry pump 15, as shown in FIG. 1B. A valve 17 is provided on the bypass exhaust pipe 16.

In an ECR plasma CVD apparatus 10' having such a bypass, in a cleaning process, the gate valve 12 is closed, and the valve 17 is opened to perform an exhaust operation by the bypass exhaust pipe 16 and the dry pump 15 while a turbo molecular pump 13 is activated. With this operation, the internal pressure of the turbo molecular pump 13 is kept at a high vacuum degree, so that the normal operation of the turbo molecular pump is ensured. Accordingly, the cleaning process can be executed without stopping the turbo molecular pump 13.

When the bypass exhaust pipe 16 and the valve 17 (to be referred to as a bypass line hereinafter) are provided like in the above ECR plasma CVD apparatus 10', however, generation source, and a target object is more likely the apparatus is bulky and complicated due to the bypass line.

To set the interior of the plasma processing chamber 11 to the high vacuum condition, it is preferable to arrange the turbo molecular pump 13 near the plasma processing chamber 11 as close as possible. Therefore, the gate valve 12 is arranged very near the plasma processing chamber 11. Owing to this arrangement, reaction products tend to attach to the inside of the gate valve 12 to cause generation of particles, resulting in a decrease in yield. Moreover, since the gate valve 12 is near the plasma processing chamber 11, an O-ring, a bearing, and the like of the gate valve 12 may be damaged by a plasma generated in the plasma processing chamber 11 in film deposition, decreasing the reliability and the production efficiency.

SUMMARY OF THE INVENTION

It is the first object of the present invention to provide a semiconductor processing apparatus which can suppress generation of particles and increase the yield, the reliability, and the production efficiency.

It is the second object of the present invention to provide a method of cleaning a semiconductor processing apparatus which can suppress generation of particles and increase the yield, the reliability, and the production efficiency.

The present invention provides a semiconductor processing apparatus for ECR plasma CVD, comprising:

a plasma generation chamber to which a microwave and a plasma source gas are introduced;

an excitation solenoid, surrounding the plasma generation chamber, for forming an electron cyclotron resonance magnetic field with the microwave in the plasma generation chamber;

a plasma reaction chamber which is provided in communication with the plasma generation chamber and to which a reactive gas is introduced;

holding means, set in the plasma reaction chamber, for holding a target object;

a leakage-type valve which is provided in communication with the plasma reaction chamber and whose opening degree can be freely controlled;

a high-vacuum pump coupled to an outlet of the leakage-type valve;

cleaning gas supply means for supplying a cleaning gas into the plasma reaction chamber; and a sub-pump coupled to an outlet of the high-vacuum pump.

The present invention provides a method of cleaning a semiconductor processing apparatus for ECR plasma CVD which comprises: a plasma generation chamber to which a microwave and a plasma source gas are introduced; an excitation solenoid, surrounding the plasma generation chamber, for forming an electron cyclotron resonance magnetic field with the microwave in the plasma generation chamber; a plasma reaction chamber which is provided in communication with the plasma generation chamber and to which a reactive gas is introduced; holding means, set in the plasma reaction chamber, for holding a target object; a leakage-type valve which is provided in communication with the plasma reaction chamber and whose opening degree can be freely controlled; a high-vacuum pump coupled to an outlet of the leakage-type valve; and a sub-pump coupled to an outlet of the high-vacuum pump, comprising the steps of:

setting the leakage-type valve to a closed condition and an interior of the plasma reaction chamber to a low vacuum atmosphere during activation of the high-vacuum pump and the sub-pump; and supplying a cleaning gas to the plasma reaction chamber in the low vacuum atmosphere, and generating a plasma to remove a film deposited in the plasma reaction chamber and the leakage-type valve.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIGS. 1A and 1B are schematic views showing conventional ECR plasma CVD apparatuses, respectively;

FIG. 3 is a sectional view showing a butterfly valve of the ECR plasma CVD apparatus shown in FIG. 2.

DETAILED DESCRIPTION OF THE PREFERRED EMBODIMENT

Figure 2:
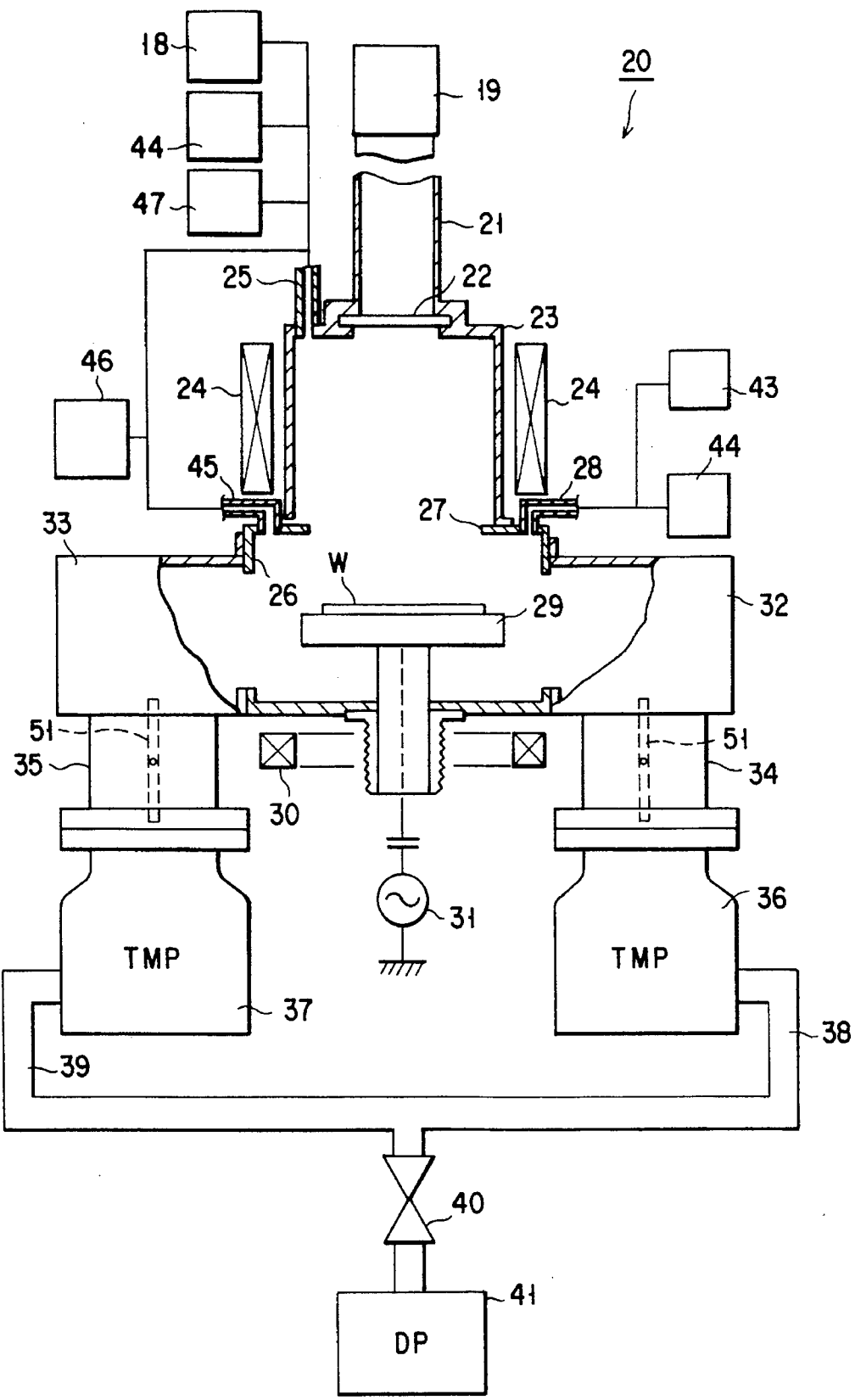
FIG. 2 is a schematic view showing an example of an ECR plasma CVD apparatus according to the present invention.

FIG. 2 shows an example of an ECR plasma CVD apparatus according to the present invention.

A waveguide 21 is connected to a microwave power supply 19. The waveguide 21 is connected to a plasma generation chamber 23. A waveguide window 22 is set between the waveguide 21 and the plasma generation chamber 23.

An excitation solenoid 24 is set around the plasma generation chamber 23. A first gas feed system 25 for introducing a gas into the plasma generation chamber 23 is connected to the plasma generation chamber 23. The first gas feed system 25 is connected to a cleaning gas supply source 18, a nitrogen gas supply source 44, F doping gas supply source 46, and, an oxygen gas supply source 47.

A plasma reaction chamber 26 is continuously arranged under the plasma generation chamber 23. A plasma extraction window 27 is set between the plasma generation chamber 23 and the plasma reaction chamber 26. A plasma flow is extracted to the plasma reaction chamber 26 via the plasma extraction window 27.

A second gas feed system 28 and a third gas feed system 45 are connected to the plasma reaction chamber 26. A substrate holder 29 is set in the plasma reaction chamber 26 at a downstream position from the inlet port of the second gas feed system 28. The second gas feed system 28 is connected to a silane gas supply source 43 while the third gas feed system 45 is connected to a F doping gas supply source 46.

A sub-solenoid 30 is arranged on the lower surface side of the substrate holder 29 so as to be coaxial with the excitation solenoid 24. The sub-solenoid 30 generates a magnetic field having a reverse direction to that of the excitation solenoid 24, thereby forming a mirror or cusped magnetic field around a substrate W. An RF power supply 31 is connected to the substrate holder 29.

Two exhaust ports 32 and 33 are formed in the side wall surface of the plasma reaction chamber 26 at positions symmetrical about the center of the plasma reaction chamber 26. Leakage-type butterfly valves 34 and 35 are provided at the lower portions of the exhaust ports 32 and 33, respectively.

Two turbo molecular pumps 36 and 37 are connected on the downstream sides of the butterfly valves 34 and 35, respectively. These turbo molecular pumps 36 and 37 are used for setting the interior of the plasma reaction chamber 26 to a high vacuum atmosphere. A high vacuum means a pressure of, e.g., several mTorr, and more particularly, a pressure within the range from 0.5 to 5 mTorr. Formation of such a high vacuum atmosphere needs a pump having a large discharge amount and an ability of accomplishing the high vacuum. More particularly, like the turbo molecular pumps 36 and 37, a pump is required for a discharge amount of 1000 to 3000 l/sec and a pressure which the pump can generate (to be referred to as generatable-pressure hereinafter), of $10^{-6}$ to $10^{-8}$ mTorr. The pump to be used in this apparatus, however, is not limited to the turbo molecular pumps 36 and 37, and any pump can be used, provided that it has the equal discharge amount and generatable-pressure to those of the turbo molecular pumps 36 and 37. Note that such a pump is called a high-vacuum pump.

Exhaust pipes 38 and 39 are connected to the turbo molecular pumps 36 and 37, respectively. The exhaust pipes 38 and 39 are coupled together to one pipe, which is connected to a dry pump 41 via a control valve 40. This dry pump 41 is used to reduce the pressure in the plasma reaction chamber 26 to a pressure at which the turbo molecular pumps 36 and 37 can be driven before driving the turbo molecular pumps 36 and 37. For this reason, a pump (to be referred to as a sub-pump hereinafter) used for this preliminary pressure reduction need not have a large discharge amount and a high generatable-pressure, unlike the turbo molecular pumps 36 and 37. Any sub-pump can be used, provided that it has a discharge amount of, for example, 20 to 80 l/sec and a generatable-pressure of, for example, 1 to 5 mTorr.

FIG. 3 shows an example of the butterfly valve 34, 35. The butterfly valve 34, 35 is constituted by a rotary shaft 50, a flapper 51 constituted to be rotatable about the rotary shaft 50, a driving mechanism (not shown in the figure), and an inner pipe wall 52. In the butterfly valve 34 (35), the angle of the flapper 51 is changed by rotating the rotary shaft 50 by the driving mechanism to adjust the opening degree of a gap between the flapper 51 and the inner pipe wall 52.

The size of the flapper 51 is designed to have a slight gap (e.g., a gap of about 0.1 mm) between the flapper 51 and the inner pipe wall 52 in a condition wherein the flapper 51 is completely closed, i.e., in a condition wherein the flapper 51 is substantially horizontal (to be referred to as a full closed condition hereinafter), as represented by a solid line in FIG. 3. In this manner, the present invention can use the valve which allows a slight air flow to generate even in the complete closed condition. Such a valve is called a leakage-type valve.

Film formation and cleaning processes in an ECR plasma CVD apparatus 20 described above will be described below.

First, the silicon wafer W is placed on the substrate holder 29. Next, the butterfly valves 34 and 35 are set in a full open condition, and at the same time the control valve 40 is also in a full open condition. In this condition, the dry pump 41 is activated to reduce the pressure in the plasma reaction chamber 26 to the range of 0.1 to 1 Torr. Then, the two turbo molecular pumps 36 and 37 are operated to decrease the pressure in the plasma reaction chamber 26 to a predetermined high vacuum of, e.g., several mTorr, and more particularly, to the range of 0.5 to 5 mTorr. This internal condition is kept.

A microwave generated by the microwave power supply 19 is introduced into the plasma generation chamber 23 via the waveguide 21 and the waveguide window 22. The oxygen gas as a plasma source gas is introduced from the first gas feed system 25 to the plasma generation chamber 23 to generate a plasma.

The generated plasma is extracted to the plasma reaction chamber 26 due to an electron cyclotron resonance magnetic field formed by the excitation solenoid 24. The silane gas as reactive gases are introduced into the plasma reaction chamber 26 via the second gas feed system 28. The introduced silane gas is decomposed by the energy of the plasma. The decomposition products of the silane gas are deposited on the surface of the wafer W placed on the substrate holder 29 due to a mirror magnetic field area formed around the substrate holder 29 by the excitation solenoid 24 and the sub-solenoid 30, thereby forming a silicon oxide film.

After the above film deposition process of the silicon oxide film on the surface of the wafer W is performed at several times, the following cleaning process is performed to remove the silicon oxide film attached to the inner wall surface of the plasma reaction chamber 26 and the two surfaces 51a and 51b of the flappers 51 of the butterfly valves 34 and 35.

The two butterfly valves 34 and 35 are set in the full closed condition with the two turbo molecular pumps 36 and 37 and the dry pump 41 being kept operating. Simultaneously, the control valve 40 can be closed to a certain degree to limit evacuation. With this operation, the pressure in the plasma reaction chamber 26 is set to a low vacuum atmosphere in which the turbo molecular pumps 36 and 37 can be driven, e.g., to several Torr, and more particularly, within the range of 0.1 to 2 Torr. Note that another means for increasing the pressure in the plasma reaction chamber 26 is to decrease the rotational speeds of the turbo molecular pumps 36 and 37.

A cleaning gas (e.g., $NF_3$) is supplied via the first gas feed system 25 to the plasma reaction chamber 26 in such a low vacuum atmosphere. At the same time, a plasma is generated. This removes the silicon oxide films deposited in the plasma generation chamber 23, the plasma reaction chamber 26 and on the exhaust ports 32 and 33 and the surfaces of the butterfly valves 34 and 35. When the butterfly valves 34 and 35 are in the full closed condition, one surface of each of the flappers 51 of the butterfly valves 34 and 35 faces upward, i.e., to the direction of the plasma reaction chamber 26. With this arrangement, the plasma generated in the plasma reaction chamber 26 cleans one surface of each flapper 51.

In the film deposition process, however, the flappers 51 are in the substantially vertical condition, so that the silicon oxide film is deposited on two surfaces 51a and 51b of each flapper 51. Accordingly, it is preferable that the flappers 51 of the butterfly valves 34 and 35 used in the present invention be rotatable substantially through 180° on the basis of the horizontal direction. In this case, each flapper 51 can rotate from a full closed condition wherein one surface 51a faces upward to a full closed condition wherein the other surface 51b faces upward, as indicated by arrows A in FIG. 3. With this arrangement, the two surfaces 51a and 51b of the flapper 51 can be faced upward, i.e., to the direction of the plasma reaction chamber 26. The plasma generated in the plasma reaction chamber 26 can clean the two surfaces 51a and 51b of the flapper 51. In a cleaning process, the silicon oxide film deposited on one surface 51a of the flapper 51 is removed. In the next cleaning process, the silicon oxide film on the other surface 51b of the flapper 51 is removed. As a result, it can be avoided that any one surface of the flapper 51 is not cleaned, and that the silicon oxide film is left uncleaned on the surface.

As described above, the butterfly valves 34 and 35 are of the leakage type. Therefore, a slight gas flow is formed even in the full closed condition. For this reason, the present invention has an advantage the cleaning process can be performed while the turbo molecular pumps 36 and 37 drive.

The butterfly valves 34 and 35 do not use an O-ring having a large bore diameter and the like, unlike a gate valve. Accordingly, for example, the butterfly valves 34 and 35 are free from degradation caused by the influence of a cleaning plasma to avoid a decrease in service life. Further, maintenance need not be frequently performed.

As has been described above, according to this embodiment, the turbo molecular pumps 36 and 37 need not be stopped every cleaning process. For this reason, the stop and start operations of the turbo molecular pumps 36 and 37 can be omitted to shorten a time required for a cleaning process.

The ECR plasma CVD apparatus 20 of this embodiment does not require a bypass line, unlike in FIG. 1B. For this reason, a smaller and simpler apparatus can be realized. Also, maintenance of a bypass line is not required.

In the ECR plasma CVD apparatus 20 of this embodiment, an air flow from the plasma reaction chamber 26 to the turbo molecular pumps 36 and 37 depends on a viscous flow when a pressure in the plasma reaction chamber 26 becomes a low vacuum. To prevent offset of an air flow and to make a cleaning gas spread all over the interior of the plasma reaction chamber 26, the turbo molecular pumps 36 and 37 are preferably attached to positions symmetrical about the center of the plasma reaction chamber 26, as described above.

To increase a conductance of the turbo molecular pumps 36 and 37 in a high vacuum atmosphere and increase the exhaust efficiency, the turbo molecular pumps 36 and 37 are preferably attached to positions near the plasma reaction chamber 26 as close as possible.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor processing apparatus for ECR plasma CVD, comprising:

a plasma generation chamber to which a microwave and a plasma source gas are introduced;

an excitation solenoid, surrounding said plasma generation chamber, for forming an electron cyclotron resonance magnetic field with the microwave in said plasma generation chamber;

a plasma reaction chamber which is provided in communication with said plasma generation chamber and to which a reactive gas is introduced;

holding means, set in said plasma reaction chamber, for holding a target object;

a leakage-type valve which is provided in communication with said plasma reaction chamber and whose opening degree can be freely controlled;

a high-vacuum pump coupled to an outlet of said leakage-type valve;

cleaning gas supply means for supplying a cleaning gas into said plasma reaction chamber; and a sub-pump coupled to an outlet of said high-vacuum pump.

2. An apparatus according to claim 1, wherein said high-vacuum pump has a discharge amount of 1000 to 3000 l/sec and a discharge pressure of $10^{-6}$ to $10^{-8}$ mTorr.

3. An apparatus according to claim 2, wherein said high-vacuum pump is a turbo molecular pump.

4. An apparatus according to claim 1, wherein said sub-pump has a discharge amount of, 20 to 80 l/sec and a discharge pressure of, 1 to 5 mTorr.

5. An apparatus according to claim 4, wherein said sub-pump is a dry pump.

6. An apparatus according to claim 1, wherein said leakage-type valve is a butterfly valve.

7. An apparatus according to claim 6, wherein a flapper of said butterfly valve is rotatable substantially through 180° on the basis of a horizontal direction.

8. An apparatus according to claim 1, wherein two pairs of leakage-type valves and high-vacuum pumps are provided, and said two pairs of leakage-type valves and high-vacuum pumps are arranged at positions symmetrical about a center of said plasma reaction chamber as a central axis.

9. An apparatus according to claim 1, further comprising a control valve arranged between said high-vacuum pump and said sub-pump.

* * * * *